United States Patent
Chen et al.

(10) Patent No.: US 8,927,388 B2
(45) Date of Patent: Jan. 6, 2015

(54) METHOD OF FABRICATING DIELECTRIC LAYER AND SHALLOW TRENCH ISOLATION

(71) Applicant: United Microelectronics Corp., Hsin-Chu (TW)

(72) Inventors: Jei-Ming Chen, Tainan (TW); Wen-Yi Teng, Kaohsiung (TW); Chia-Lung Chang, Tainan (TW); Chih-Chien Liu, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 49 days.

(21) Appl. No.: 13/677,318

(22) Filed: Nov. 15, 2012

(65) Prior Publication Data
US 2014/0134824 A1    May 15, 2014

(51) Int. Cl.
  *H01L 21/76*   (2006.01)
  *H01L 21/762*   (2006.01)
  *H01L 21/3105*   (2006.01)
  *H01L 21/768*   (2006.01)
  *H01L 21/02*   (2006.01)

(52) U.S. Cl.
  CPC ...... *H01L 21/76224* (2013.01); *H01L 21/3105* (2013.01); *H01L 21/76819* (2013.01); *H01L 21/76826* (2013.01); *H01L 21/76837* (2013.01); *H01L 21/02164* (2013.01)
  USPC ............. 438/424; 438/438; 257/E21.545

(58) Field of Classification Search
  USPC .................. 438/424, 438, 428, 436
  See application file for complete search history.

(56) References Cited

U.S. PATENT DOCUMENTS

| | | | |
|---|---|---|---|
| 6,509,593 B2 * | 1/2003 | Inoue et al. | 257/295 |
| 6,576,053 B1 * | 6/2003 | Kim et al. | 117/89 |
| 6,855,607 B2 | 2/2005 | Achuthan | |
| 7,013,446 B2 | 3/2006 | Ohba | |
| 7,098,121 B2 * | 8/2006 | Mori et al. | 438/551 |
| 7,112,495 B2 | 9/2006 | Ko | |
| 7,250,658 B2 | 7/2007 | Doris | |
| 7,521,324 B2 | 4/2009 | Ohmi | |
| 7,531,437 B2 | 5/2009 | Brask | |
| 7,592,270 B2 | 9/2009 | Teo | |
| 7,947,551 B1 | 5/2011 | Syue | |
| 8,003,489 B2 * | 8/2011 | Eun | 438/435 |
| 8,154,102 B2 * | 4/2012 | Matsuda et al. | 257/510 |
| 2003/0015731 A1 * | 1/2003 | Curless et al. | 257/200 |
| 2007/0015365 A1 | 1/2007 | Chen | |
| 2007/0072376 A1 | 3/2007 | Chen | |
| 2007/0218661 A1 | 9/2007 | Shroff | |
| 2008/0061366 A1 | 3/2008 | Liu | |
| 2009/0057759 A1 | 3/2009 | Obradovic | |
| 2009/0104791 A1 * | 4/2009 | Nemani et al. | 438/788 |
| 2009/0124097 A1 | 5/2009 | Cheng | |
| 2009/0200494 A1 | 8/2009 | Hatem | |
| 2010/0044783 A1 | 2/2010 | Chuang | |
| 2010/0048027 A1 | 2/2010 | Cheng | |
| 2010/0101849 A1 * | 4/2010 | Sunohara et al. | 174/260 |
| 2010/0129994 A1 | 5/2010 | Awad | |
| 2011/0147812 A1 * | 6/2011 | Steigerwald et al. | 257/288 |
| 2012/0244717 A1 * | 9/2012 | Zhang et al. | 438/709 |

* cited by examiner

*Primary Examiner* — Reema Patel
(74) *Attorney, Agent, or Firm* — Winston Hsu; Scott Margo

(57) ABSTRACT

A method of fabricating a dielectric layer includes the following steps. At first, a dielectric layer is formed on a substrate, and a chemical mechanical polishing (CMP) process is performed on the dielectric layer. Subsequently, a surface treatment process is performed on the dielectric layer after the chemical mechanical polishing process, and the surface treatment process includes introducing an oxygen plasma.

19 Claims, 7 Drawing Sheets

METHOD OF FABRICATING DIELECTRIC LAYER AND SHALLOW TRENCH ISOLATION

BACKGROUND OF THE INVENTION

1. Field of the Invention

The present invention relates to a method of fabricating a dielectric layer, and more particularly, to a surface treatment process applicable to a dielectric layer of a shallow trench isolation (STI).

2. Description of the Prior Art

In the design of semiconductor devices, each metal-oxide-semiconductor (MOS) transistor component must be well isolated to prevent interference and short-circuiting. In general, localized oxidation isolation (LOCOS) or shallow trench isolation (STI) methods are used to isolate and protect MOS transistors. In the LOCOS process, a field oxide layer occupies a very large area on the semiconductor wafer, and a bird's beak is generated. Therefore, the STI having the advantages of small isolation line width, explicit division of active regions, uniform depth of isolation regions, scalable size and excellent planar structure of isolation regions has become a preferred ideal isolation technology at present.

The common processes of forming a STI are described as follows. First, recesses are formed in the semiconductor substrate between MOS transistors. Then, the recess is filled with insulating material, and the insulating material is further planarized to be an insulating region used for isolation. With a trend towards scaling down the size of MOS transistors for achieving high integration rates, when a chemical vapor deposition (CVD) process is used to deposit a dielectric layer to fill the recess, the high aspect ratio of the recess may cause overhang at the top corner of the recess, and voids may be found in the formed STI.

During the conventional manufacturing processes of the semiconductor device, the etching process and the cleaning process, such as an etching process for removing a cap layer and a hard mask layer on each transistor, an etching process for forming spacers, a pre-cleaning process performed after the etching process for forming the spacers, a cleaning process performed after forming the source/drain electrode in the active region, a pre-cleaning process performed before forming the silicide layers, and an etching process for removing metal layers without reacting, are performed several times. During the etching processes and the cleaning processes, the exposed STI is damaged by the etching processes and the cleaning processes, thereby forming breaks on the surface of the STI, or spaces in the interface between the STI and the substrate.

Consequently, how to improve the STI process in order to prevent the formation of the illustrated defects and to avoid the current leakage is an important issue in this field.

SUMMARY OF THE INVENTION

It is therefore one of the objectives of the present invention to provide a method of fabricating a dielectric layer and a shallow trench isolation (STI) in order to reduce the formation of defects during the dielectric layer process or the STI process.

An exemplary embodiment of the present invention provides a method of fabricating a dielectric layer that includes the following steps. At first, a dielectric layer is formed on a substrate, and a chemical mechanical polishing (CMP) process is performed on the dielectric layer. Subsequently, a surface treatment process is performed on the dielectric layer after the chemical mechanical polishing process, and the surface treatment process includes introducing an oxygen plasma.

Another exemplary embodiment of the present invention provides a method of fabricating a shallow trench isolation that includes the following steps. At first, a recess is formed in a substrate, and a dielectric layer is formed to fill the recess. Subsequently, a chemical mechanical polishing (CMP) process is performed on the dielectric layer. Furthermore, a surface treatment process is performed on the dielectric layer after the chemical mechanical polishing process, and the surface treatment process includes introducing an oxygen plasma.

Flowable chemical vapor deposition (FCVD) process is performed to form the dielectric layer in the present invention, therefore, the formed dielectric layer can overall cover the substrate, and the recess having high aspect ratio can be totally filled up with the dielectric layer without voids or spaces, i.e. the dielectric layer formed through FCVD process provides good gap filling effect. Additionally, after the planarization process performed on a dielectric layer, the oxygen plasma is further used to treat the surface of the dielectric layer for doping oxygen radicals into a part of the dielectric layer, therefore, the dangling bonds in the dielectric layer may crosslink in order to evaluate the structural density of the dielectric layer, for example, the structure of the upper part of the dielectric layer (penetrated by O radicals) may be denser than the structure of the lower part of the dielectric layer (not penetrated by O radicals). Accordingly, the dielectric layer may not be damaged during the following etching processes and the following cleaning processes, and the structural completeness and the isolation effect of the dielectric layer can be enhanced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
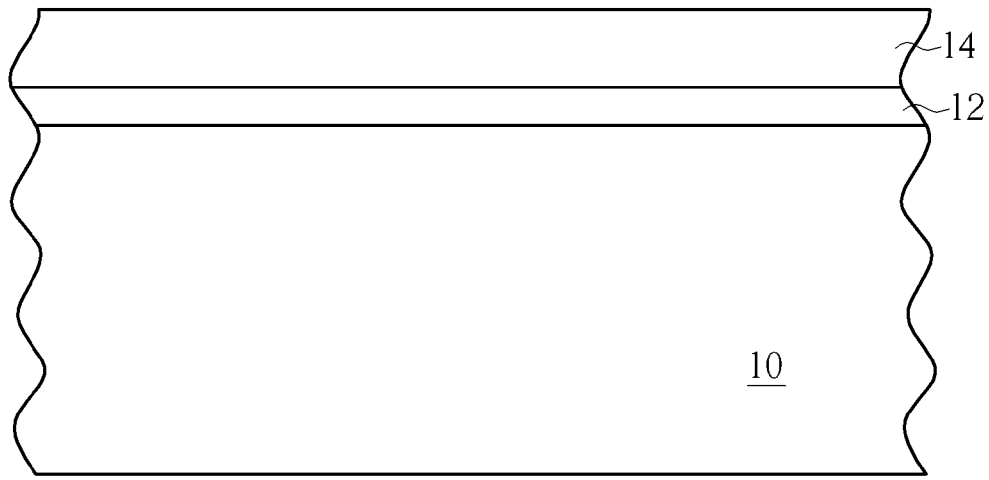
FIG. 1 through FIG. 6 illustrate a method of fabricating a shallow trench isolation (STI) according to a preferred exemplary embodiment of the present invention.

Please refer to FIG. 1 through FIG. 6, which illustrate a method of fabricating a shallow trench isolation (STI) according to a preferred exemplary embodiment of the present invention. As shown in FIG. 1, a silicon oxide layer 12 which could be formed through thermal oxidation method or chemical vapor deposition process and a silicon nitride layer 14 which could be formed through low pressure chemical vapor deposition (LPCVD) process are sequentially formed on a substrate 10. The substrate 10 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The silicon oxide layer 12 may serve as pad oxide which is the stress barrier layer of the silicon nitride layer 14, and the silicon oxide layer 12 can improve the adhesion effect between the silicon nitride layer 14 and the substrate 10. Furthermore, the silicon nitride layer 14 can serve as a hard mask in later etching processes or a stop layer in later chemical mechanical polishing (CMP) processes. The method of forming the silicon oxide layer 12 and the method of forming the silicon nitride layer 14 are not limited to thermal oxidation method or LPCVD as illustrated above, the other processes such as wet chemical oxidation process or other chemical vapor deposition (CVD) processes could also be used to form the layers.

Figure 2:
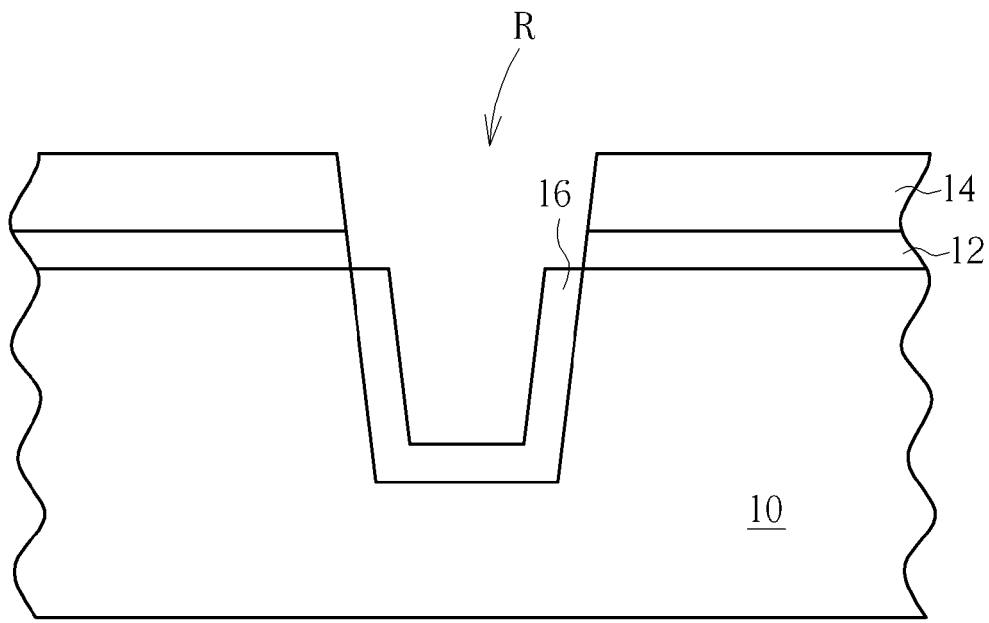

As shown in FIG. 2, photolithography processes and etching processes are implemented to form at least a recess R in a predetermined region of the substrate 10, and the recess R penetrates through the silicon nitride layer 14 and the silicon oxide layer 12, and penetrates into the substrate 10 to a predetermined depth. For example, a photoresist layer (not shown) is formed on the silicon nitride layer 14 and a photolithography process is performed to form a patterned photoresist layer (not shown) which can be use to define the pattern of recess R. Subsequently, the patterned photoresist layer serves as a patterned mask and an etching process such as reactive-ion-etching (RIE) process is performed to remove a part of the silicon nitride layer 14, a part of the silicon oxide layer 12 and a part of the substrate 10, so as to form the recess R in the substrate 10. Then, the patterned photoresist layer is removed. Moreover, it is also applicable to transfer the patterns of the patterned photoresist layer into the silicon nitride layer 14 and the silicon oxide layer 12 in advance to form openings (not shown) exposing the substrate 10. The patterned photoresist layer is then removed, and the silicon nitride layer 14 and the silicon oxide layer 12 may serve as a patterned mask when an etching process is performed to remove a part of the substrate 10, so as to form the recess R. The type of the patterned mask used for defining the recess R and the method of forming the recess R are not limited thereto. After forming the recess R, a pull back process can be further performed on the patterned mask to modify the profile of the patterned mask.

A liner 16 is further formed to cover the substrate 10. More specifically, the liner 16 covers the surface of the recess R in order to recover the damages on the substrate 10 at the bottom of the recess R and the sidewalls of the recess R caused during the manufacturing process of the recess R. The liner 16 includes a monolayered structure or a multilayer structure, and a material of the liner 16 could be silicon oxide, silicon nitride, silicon oxynitride or any combination thereof. Furthermore, the liner 16 can be formed through a thermal oxidation process or a chemical vapor deposition (CVD) process to form a silicon oxide layer which is selectively followed by a nitridation process. In this exemplary embodiment, the liner 16 is made of silicon oxide formed through in situ steam generation (ISSG) process, but not limited thereto.

Figure 3:
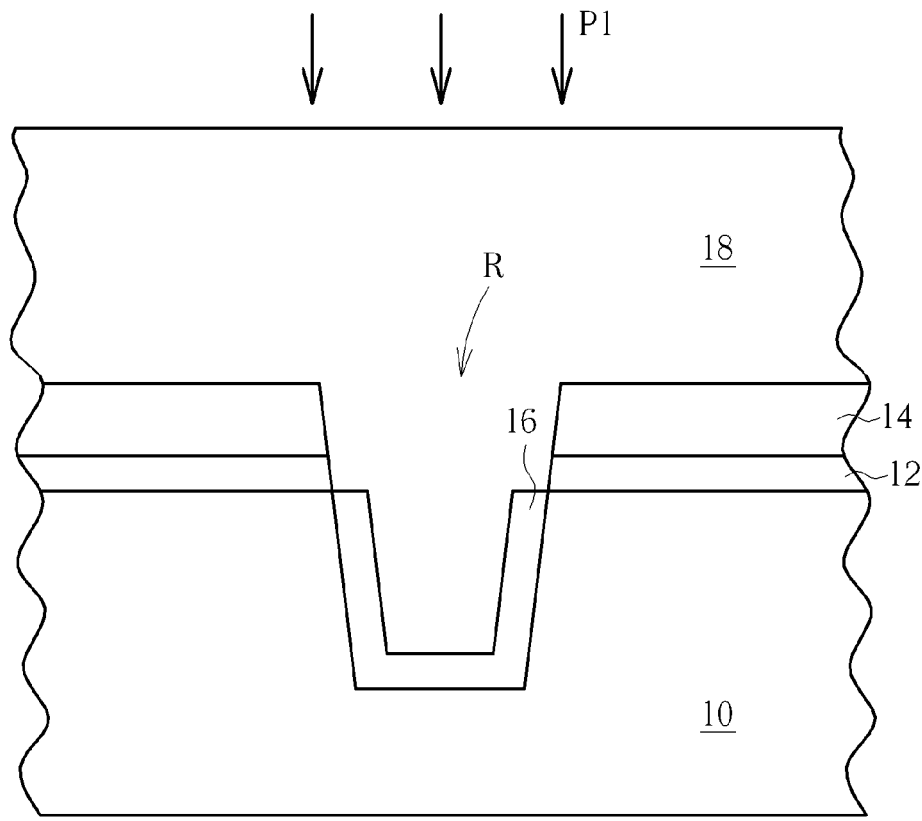

As shown in FIG. 3, a dielectric layer 18 is formed to fill the recess R. In order to totally fill the recess R having a high aspect ratio without voids, the dielectric layer 18 is preferably formed through a flowable chemical vapor deposition (FCVD) process, and the FCVD process includes the following steps. At first, a deposition process is performed to form a flowable dielectric material layer (not shown) on the substrate 10. The flowable dielectric material layer is generally in the liquid state, so the flowable dielectric material layer can therefore totally cover the bottom of the recess R and fill the overall recess R. A material of the flowable dielectric material layer may include trisilylamine (TSA). Subsequently, a curing process is performed on the flowable dielectric material layer, and the curing process could be an ozone ($O_3$) plasma treatment process, so as to transfer the flowable dielectric material layer into the dielectric layer 18 such as silicon oxide layer. A processing temperature range of the curing process is between 100 degrees centigrade (° C.) and 250 degrees centigrade. The curing process could be performed only one time after the deposition process for saving process time, but not limited thereto, the deposition process and the curing process can be alternately performed as well. In other exemplary embodiments, the flowable dielectric material layer can also be directly transferred into the dielectric layer 18 through an oxidation process by directly introducing oxygen, ozone or steam.

The dielectric layer 18 is not limited to be formed through a FCVD process. A high density plasma chemical vapor deposition (HDPCVD) process, a sub atmosphere chemical vapor deposition (SACVD) process, or a spin on dielectric (SOD) process may be performed to form the dielectric layer 18 to fill the recess R as well.

In order to further increase the structural density of the dielectric layer 18, after the curing process, a thermal treatment process P1 could be performed on the dielectric layer 18. The thermal treatment process P1 includes a steam-containing thermal treatment process and a nitrogen-containing thermal treatment process. A processing temperature range of the steam-containing thermal treatment process is between 600 degrees centigrade (° C.) and 800 degrees centigrade, a processing temperature of the nitrogen-containing thermal treatment process is larger than 1000 degrees centigrade. More specifically, the steam-containing thermal treatment process includes introducing steam into a reaction chamber having a temperature range between 600 degrees centigrade and 800 degrees centigrade, and the nitrogen-containing thermal treatment process includes introducing nitrogen into a reaction chamber having a temperature larger than 1000 degrees centigrade.

Figure 4:
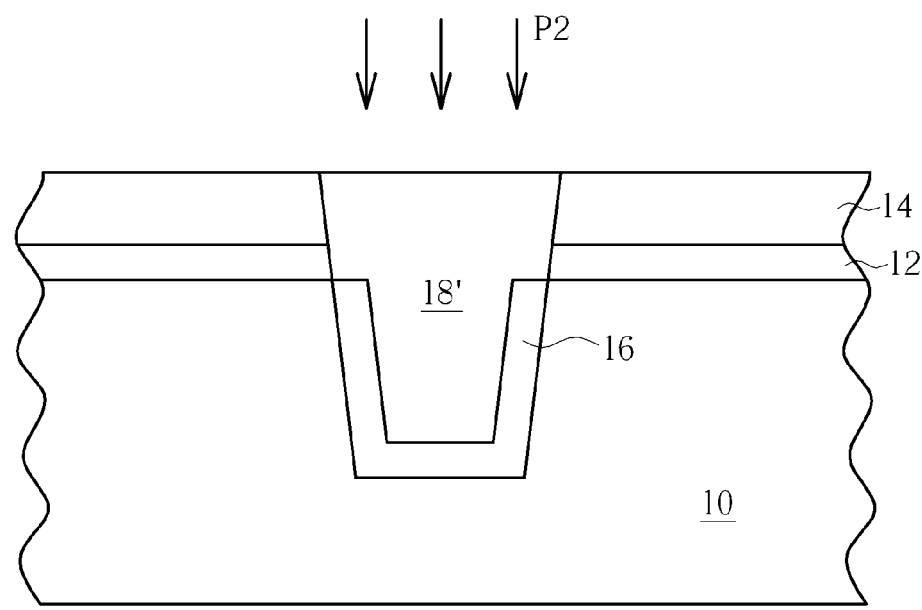

As shown in FIG. 4, a planarization process such as a chemical mechanical polishing (CMP) process is performed on the dielectric layer 18, and the silicon nitride layer 14 could serve as an polishing stop layer. Therefore, a part of the dielectric layer 18 and a part of the liner are removed in order to planarize the dielectric layer 18, so as to form the dielectric layer 18', and a top surface of the dielectric layer 18' may be aligned with a top surface of the silicon nitride layer 14. Subsequently, after the chemical mechanical polishing process, a surface treatment process P2 is performed on the dielectric layer 18'. A processing temperature range of the surface treatment process P2 is substantially lower than the processing temperature range of the thermal treatment process P1. Furthermore, the processing time of the surface treatment process P2 is substantially shorter than the processing time of the thermal treatment process P1 for thermal budget concern. In this exemplary embodiment, the surface treatment process P2 includes introducing an oxygen plasma such as a high density plasma (HDP) containing oxygen, the processing temperature range of the surface treatment process P2 is substantially between 300 degrees centigrade (° C.) and 400 degrees centigrade, and the processing time of the surface treatment process P2 is substantially less than 1 minutes, for example.

It is appreciated that, the surface treatment process P2 is performed to provide oxygen radicals (O radicals) to penetrate through a part of the dielectric layer 18', so the dangling bonds in the dielectric layer 18' may crosslink each other due to the oxygen radicals, and the structural density of the dielectric layer 18' can be improved. The penetration depth of the oxygen radicals can be modified according to the radio frequency (RF) power and the processing time. Accordingly, the structure of the upper part of the dielectric layer 18' (penetrated by O radicals) is denser than the structure of the lower part of the dielectric layer 18' (not penetrated by O radicals), which can prevent the exposed surface of the dielectric layer 18' from being damaged by the etchant used in the later etching process or the clean solutions used in the later cleaning process, and avoid the loss of the substrate 10 at both sides of the dielectric layer 18' during later etching process and later cleaning process. The structural completeness and the isolation effect of the dielectric layer 18' can therefore be improved. Furthermore, the surface treatment process P2 is not limited to introducing oxygen plasma as illustrated in this exemplary embodiment. The oxygen radicals can also be formed by the ionization of the oxygen containing gas such as oxygen ($O_2$) or the ozone ($O_3$) through ultraviolet (UV) or heating processes.

Figure 5:
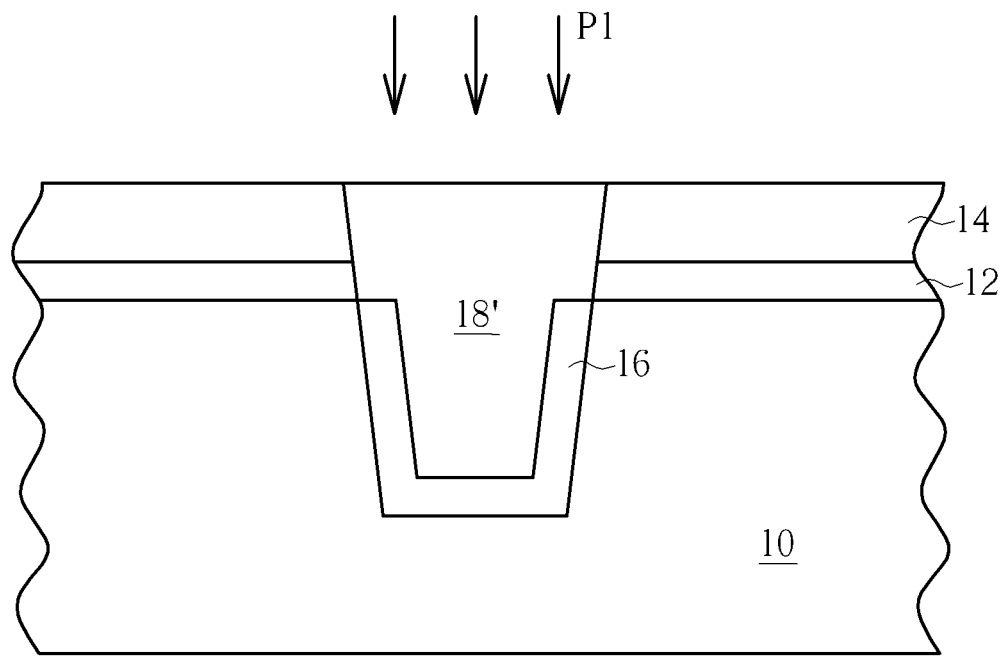
Figure 6:
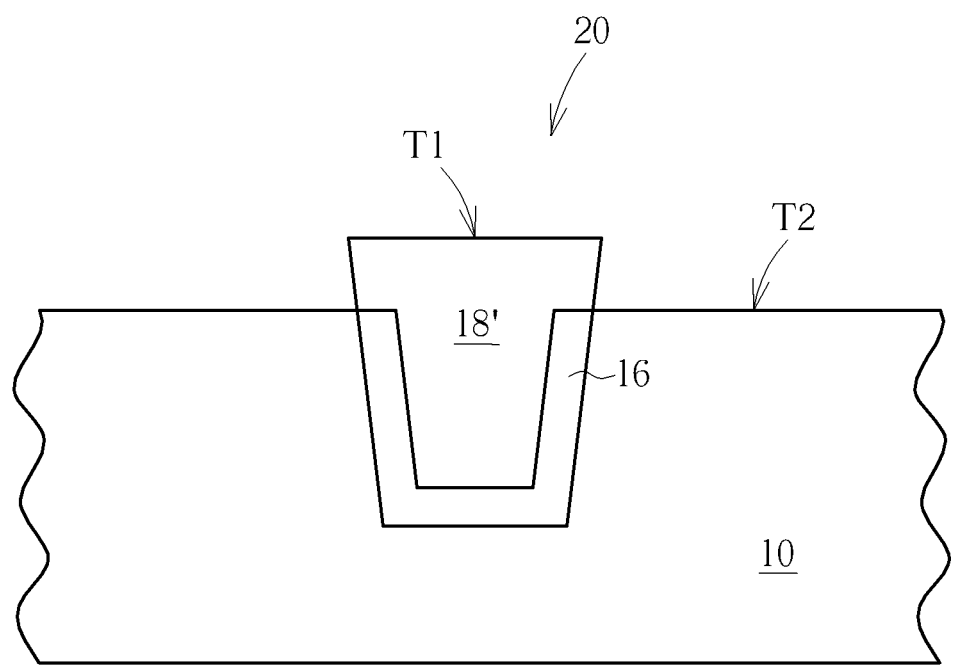

As shown in FIG. 5, according to process requirements, the thermal treatment process P1 can be selectively performed on the dielectric layer 18' again after the surface treatment process P2. In other words, under the same process conditions as in the illustrated thermal treatment process P1, the steam-containing thermal treatment process and the nitrogen-containing thermal treatment process are implemented again to further increase the structural density of the dielectric layer 18', and the processing temperature range of the thermal treatment process P1 is substantially higher than the processing temperature range of the surface treatment process P2. In other exemplary embodiments, the process conditions of the thermal treatment process performed on the dielectric layer 18' again after the surface treatment process P2 could be different from the process conditions of the thermal treatment process P1. Subsequently, a dry etching process or a wet etching process can be selectively implemented to remove a part of the dielectric layer 18' to modify a height of the upper surface of the dielectric layer 18'. In other exemplary embodiment, the etching process used to modify a height of the exposed upper surface of the dielectric layer 18' can be selectively implemented after the chemical mechanical polishing (CMP) process and before the surface treatment process P2. Finally, as shown in FIG. 6, a strip step is performed, and the strip step may include using hot phosphoric acid to remove the remaining silicon nitride layer 14, and using diluted hydrofluoric acid (HF) to remove the remaining silicon oxide layer 12 or the dielectric layer 18' protruding from the top surface of the substrate 10, otherwise, a dry etching process is performed to remove the remaining silicon nitride layer 14 and the remaining silicon oxide layer 12. Accordingly, the shallow trench isolation (STI) 20 is completed.

More specifically, when the surface of the dielectric layer 18' has been contacted by the oxygen plasma, i.e. the surface of the dielectric layer 18' has been treated by the oxygen plasma, the structural density of a part of the dielectric layer 18' may be increased. In other words, the rate for etching the dielectric layer 18' may be reduced. Therefore, as the illustrated strip step is performed, the dielectric layer 18' may not be over-etched, or invalid to overall fill the recess R. For example, the top surface T1 of the dielectric layer 18' is lower than the top surface T2 of the substrate 10. Accordingly, the implementation of the surface treatment process P2 of the present invention is beneficial for maintaining the structural completeness of the STI 20 and the substrate 10 at both sides the STI 20, especially the substrate 10 neighboring the top corners of the STI 20.

Figure 7:
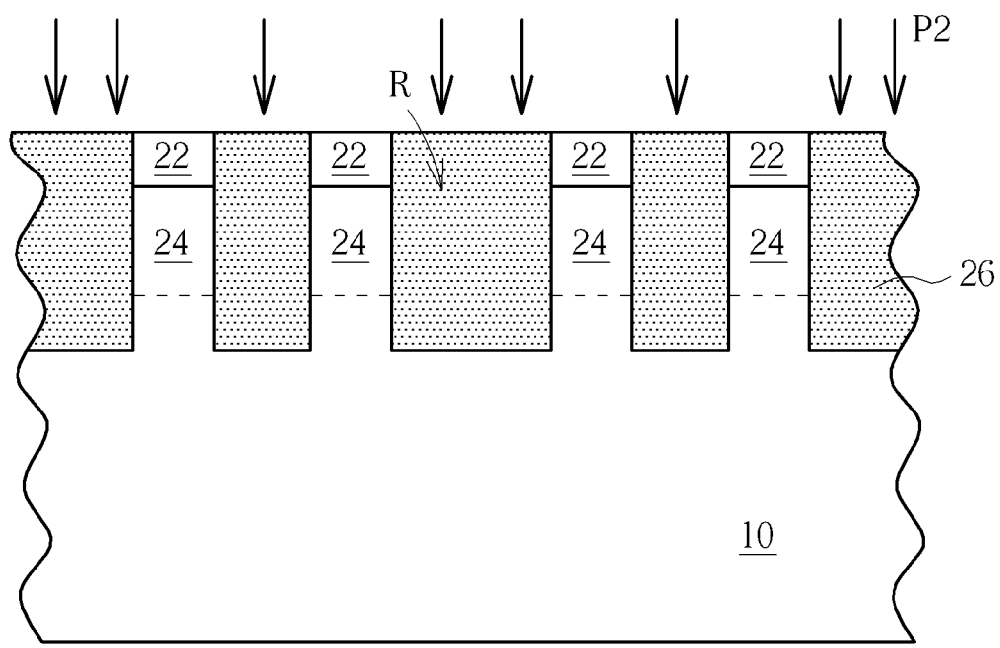
FIG. 7 through FIG. 8 illustrate a method of fabricating a shallow trench isolation (STI) according to another preferred exemplary embodiment of the present invention.
Figure 8:
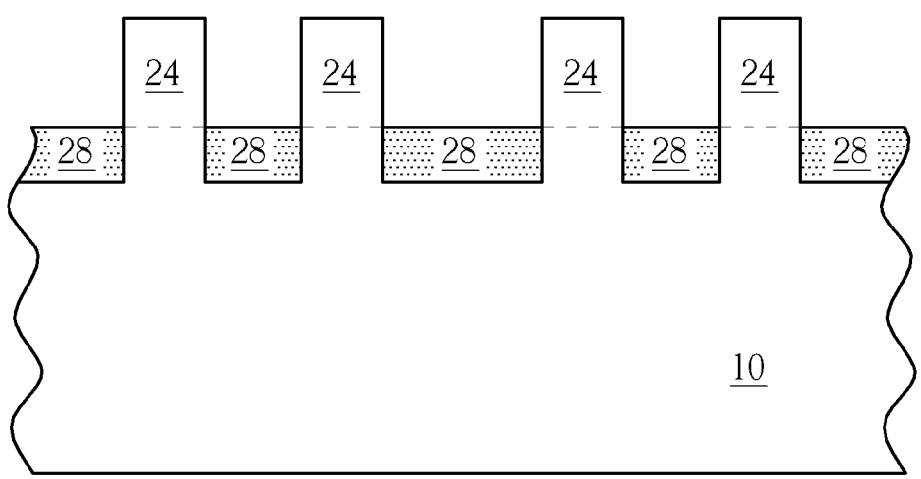

The present invention can also be integrated into the manufacturing process of the dielectric layer in the shallow trench isolation of the non-planar transistor. Please refer to FIG. 7 through FIG. 8, which illustrate a method of fabricating a shallow trench isolation (STI) according to another preferred exemplary embodiment of the present invention. As shown in FIG. 7, a patterned mask 22 is formed on the substrate 10 for defining the pattern of at least a fin structure 24. Then, an etching process is performed to remove a portion of the substrate 10 for simultaneously forming a plurality of the fin structures 24 and recesses R disposed between the fin structures 24. Subsequently, through a flowable chemical vapor deposition (FCVD) process, a high density plasma CVD (HDPCVD) process, a sub atmosphere CVD (SACVD) process or a spin on dielectric (SOD) process, at least a dielectric material layer (not shown) covering the fin structures 24 and filling the recesses R is formed on the substrate 10. Afterwards, a chemical mechanical polishing (CMP) process is performed to planarize the dielectric material layer for forming the dielectric layer 26. After the CMP process, a surface treatment process P2 is performed on the dielectric layer 26, and the surface treatment process P2 includes introducing an oxygen plasma. Finally, as shown in FIG. 8, at least an etching process is performed to remove the patterned hard mask 22 and a portion of the dielectric layer 26 to form the corresponding shallow trench isolations 28 in the substrate 10 between each of the fin structures 24.

As illustrated in the previous exemplary embodiments in FIG. 1 through FIG. 6 and FIG. 7 through FIG. 8, the characteristics of the present invention is to further perform a surface treatment process, such as an oxygen plasma treatment process, on the dielectric layer just after the chemical mechanical polishing process. The dielectric layer can serve as any type of isolation structure in the semiconductor devices. In addition to the manufacturing processes of the dielectric layer in the shallow trench isolation of the planar transistor or the non-planar transistor as illustrated above, the present invention could be integrated into other isolation structure processes such as an inter-layer dielectric (ILD) layer process or an inter-metal dielectric (IMD) layer process.

Figure 9:
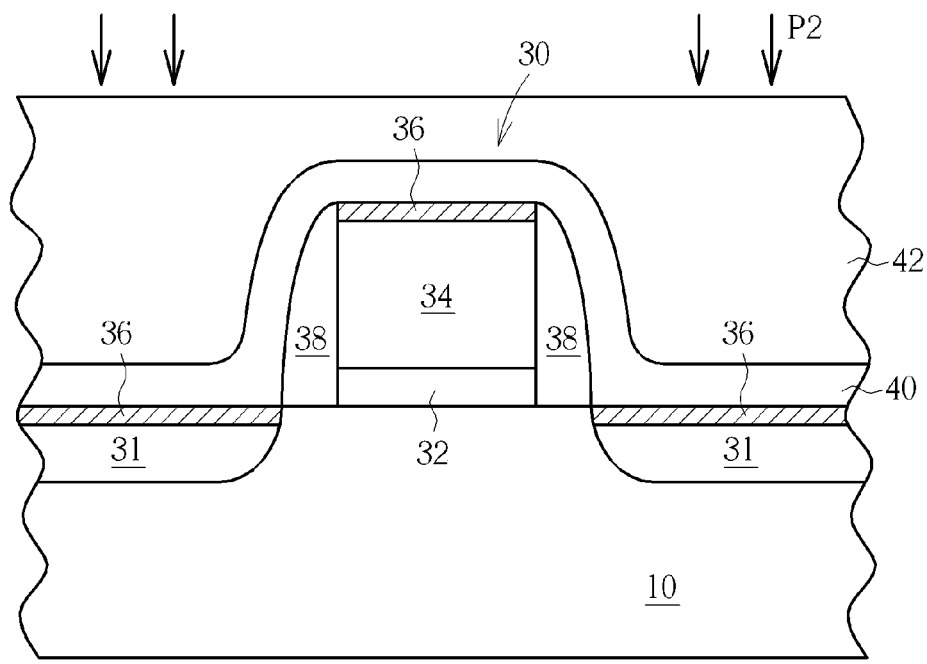
FIG. 9 through FIG. 10 illustrate a method of fabricating a metal interconnection structure according to a preferred exemplary embodiment of the present invention.

The inter-layer dielectric (ILD) layer is taken for example. Please refer to FIG. 9 through FIG. 10, which illustrate a method of fabricating a metal interconnection structure according to a preferred exemplary embodiment of the present invention. As shown in FIG. 9, a substrate 10 is provided, and a planar transistor or a non-planar transistor is subsequently formed; for example, a gate structure 30 is formed on the substrate 10 between the source/drain doped regions 31. The gate structure 30 includes a gate dielectric layer 32, a gate conductive layer 34 disposed on the gate dielectric layer 32, a cap layer (not shown) disposed on the gate conductive layer 34, and a spacer 38. As the materials and the manufacturing processes of the gate structure 30 are known to those skilled in the art, the details are omitted herein for brevity. As the gate conductive layer 34 is made of polysilicon, a self-aligned metal silicide process can be performed after removing the cap layer, in order to form the metal silicide layer 36 on the gate conductive layer 34 and the source/drain doped regions 31. Furthermore, a chemical vapor deposition (CVD) process is performed to form a contact etching stop layer (CESL) 40. Additionally, a dielectric layer 42 serving as an inter-layer dielectric layer is formed on the substrate 10. A material of the dielectric layer 42 may include low dielectric constant (low-K) material (K value smaller than 3.9), ultra low-K (ULK) material (K value smaller than 2.6), or porous ULK material. The method of forming the dielectric layer 42 includes a FCVD process, a plasma enhanced chemical vapor deposition (PECVD) process, an atmospheric pressure chemical vapor deposition (APCVD) process or a sub atmosphere chemical vapor deposition (SACVD) process.

Additionally, a planarization process such as a chemical mechanical polishing (CMP) process is performed on the dielectric layer 42. After the chemical mechanical polishing process, a surface treatment process P2 is performed on the planarized dielectric layer 42, and the surface treatment process P2 includes introducing oxygen plasma. The dangling bonds in the dielectric layer 42 may therefore crosslink each other due to the oxygen radicals. Similarly, the structure of the upper part of the dielectric layer 42 (penetrated by O radical) may be denser than the structure of the lower part of the dielectric layer 42 (not penetrated by O radical), which can prevent the exposed surface of the dielectric layer 42 from being damaged by the etchant used in later etching processes or the clean solutions used in later cleaning processes, and avoid the loss of the dielectric layer 42, thereby enhancing the structural completeness and the isolation effect of the dielectric layer 42.

Figure 10:
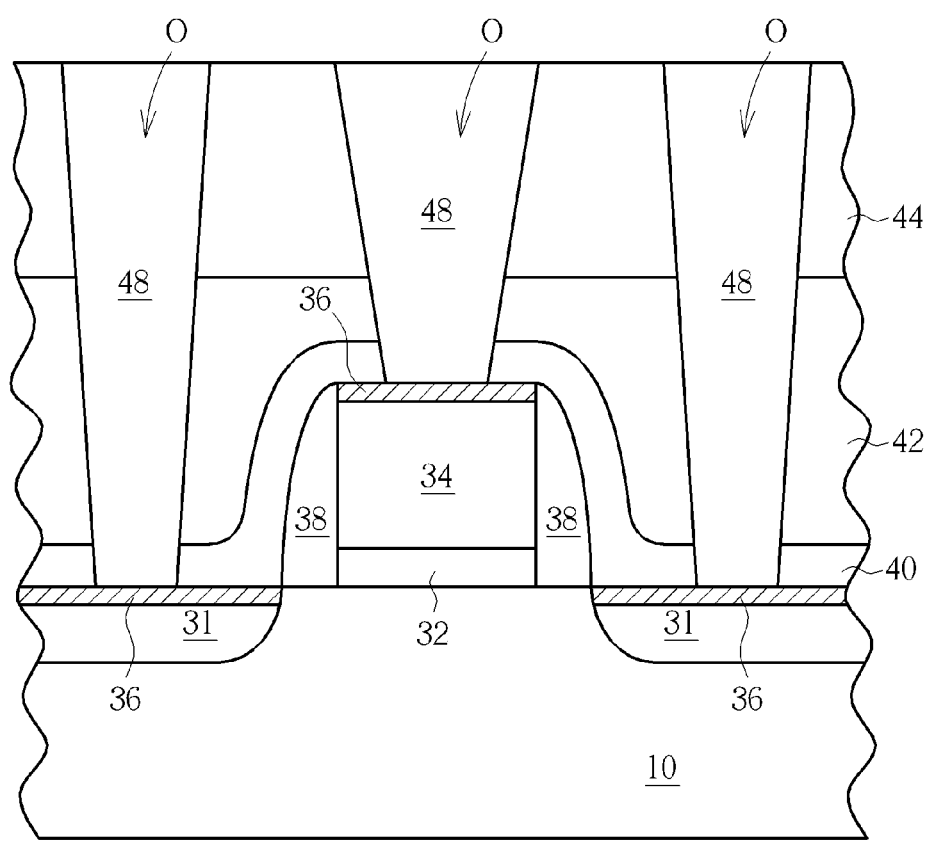

As shown in FIG. 10, a cap layer 44 is overall formed on the planarized dielectric layer 42, and the cap layer 44 could be made of dielectric materials. In other exemplary embodiments, the CMP process may be performed after consecutively and sequentially forming the dielectric layer and the cap layer, and after the CMP process used to planarize the cap layer, the surface treatment process P2 can be further performed on the cap layer made of dielectric materials. O radicals provided by the oxygen plasma of the surface treatment process P2 may therefore help to crosslink the dangling bonds in the cap layer. Similarly, the structure of the upper part of the cap layer (penetrated by O radicals) may be denser than the structure of the lower part of the cap layer (not penetrated by O radicals). Subsequently, photolithography processes and etching processes are implemented to remove a part of the cap layer 44, a part of the dielectric layer 42 and a part of the CESL 40 for forming at least a contact hole O, and the metal silicide layer 36 is exposed at the bottom of each of the contact holes O. Then, a barrier layer (not shown), a seed layer (not shown) and a conductive layer 48 are sequentially formed in each of the contact holes O, and each of the contact holes O is filled up with the conductive layer 48. Finally, a planarization process is implemented to align the surface of the conductive layer 48 with the surface of the cap layer 44. Accordingly, a metal interconnection structure is completed. As the manufacturing processes of the metal interconnection structure are known to those skilled in the art, the details are omitted herein for brevity.

In addition, the present invention may be applied in various semiconductor processes such as a metal gate processes including a gate-first process, a high-k first process integrated into the gate-last process, and a high-k last process integrated into the gate-last process.

Figure 11:
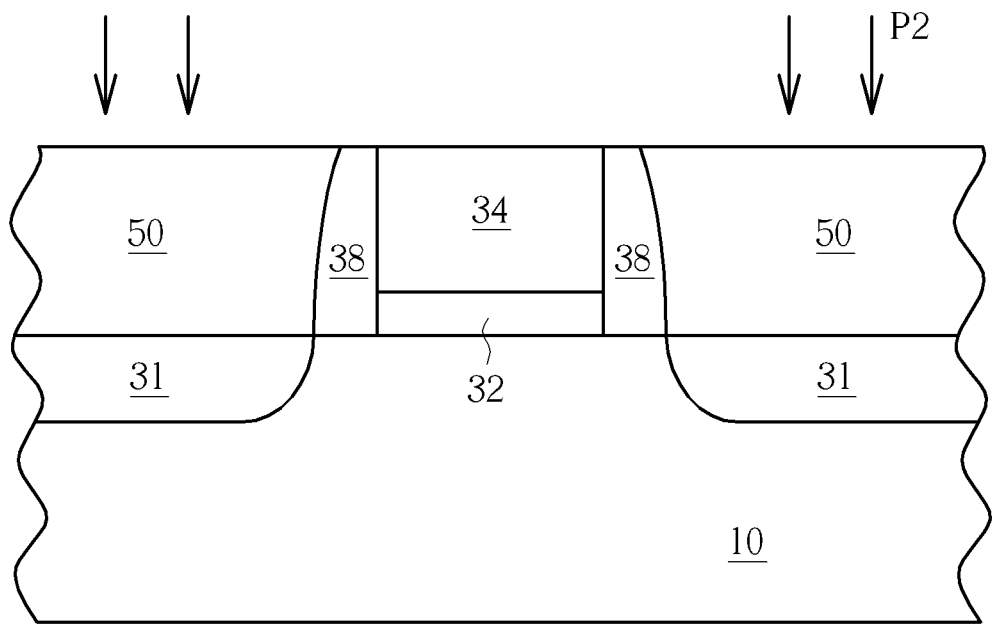
FIG. 11 through FIG. 13 illustrate a method of fabricating a metal gate structure according to a preferred exemplary embodiment of the present invention.
Figure 12:
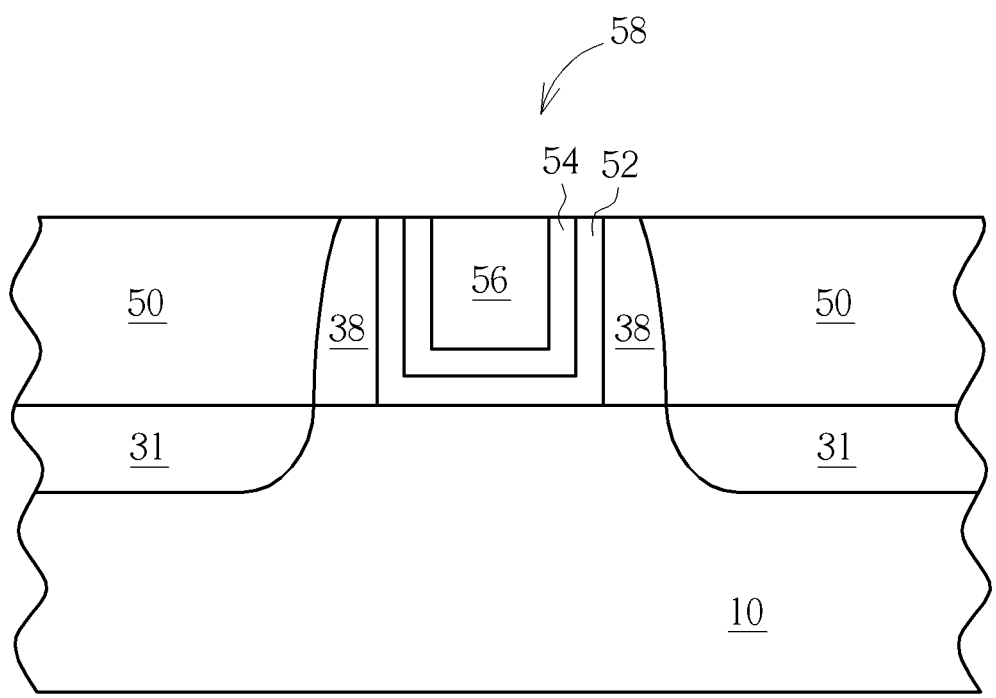

The high-k last process integrated into the gate-last process is taken for example. Please refer to FIG. 11 through FIG. 13, and refer to FIG. 9 together, which illustrate a method of fabricating a metal gate structure according to a preferred exemplary embodiment of the present invention. As shown in FIG. 11, a substrate 10 is provided, and a dielectric layer 50 formed on the substrate 10 covers a dummy gate similar to the gate structure 30 in FIG. 9. Subsequently, a planarization process such as a chemical mechanical polishing (CMP) process is performed on the dielectric layer 50 to remove a part of the dielectric layer 50 and the cap layer until the gate conductive layer 34 is exposed. Similarly, in order to improve the structural density of the dielectric layer 50, a surface treatment process P2 such as an oxygen plasma treatment process can be further performed on the dielectric layer 50 after the CMP process. Therefore, the structure of the upper part of the dielectric layer 50 (penetrated by O radicals) may be denser than the structure of the lower part of the dielectric layer 50 (not penetrated by O radicals). As shown in FIG. 12, after removing the gate conductive layer 34 and optionally removing the gate dielectric layer 32, an opening surrounded by the spacer 38 is formed, and a high dielectric constant (high-K) dielectric layer 52, a work function layer 54 and a conductive layer 56 are sequentially formed to fill the opening. Finally, a planarization process is implemented to align with each other the surface of the high-K dielectric layer 52, the surface of the work function layer 54, the surface of the conductive layer 56 and the surface of the dielectric layer 50. Accordingly, a metal gate structure 58 is completed. As the manufacturing processes of the metal gate structure are known to those skilled in the art, the details are omitted herein for brevity.

Figure 13:
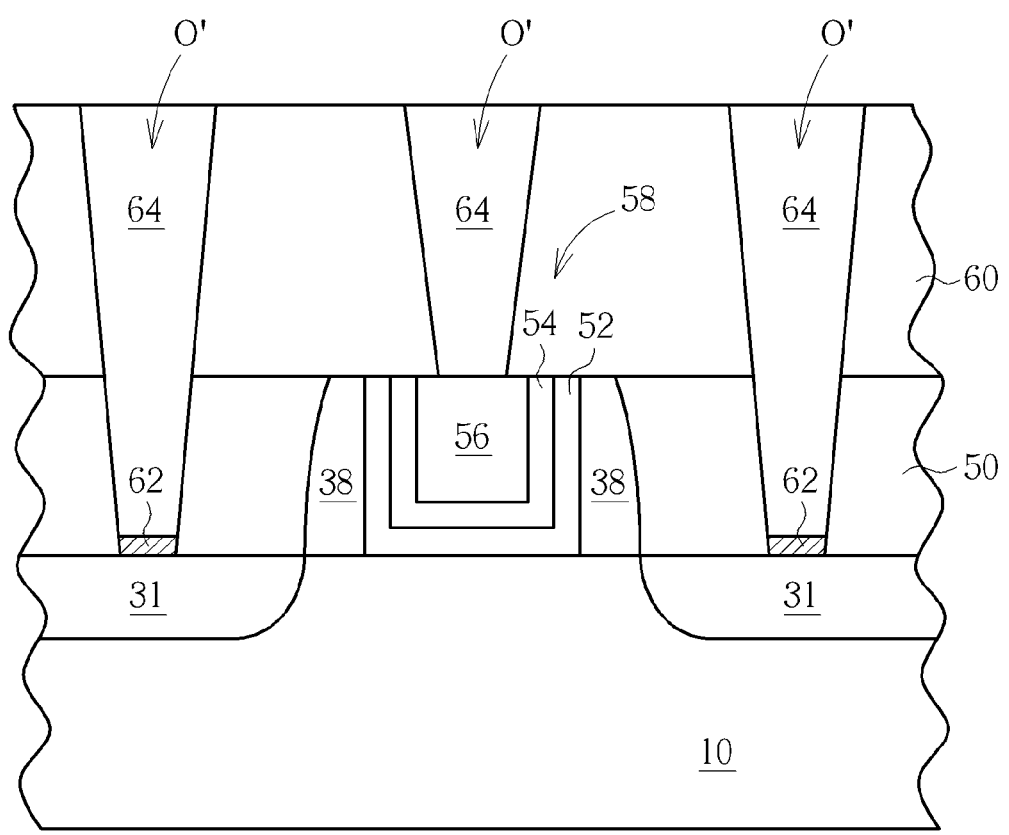

As shown in FIG. 13, a cap layer 60 is overall formed on the planarized dielectric layer 50, and the cap layer 44 could be made of dielectric materials. In other exemplary embodiments, the CMP process and the surface treatment process P2 may be sequentially performed on the cap layer as well, and similarly, the structure of the upper part of the cap layer (penetrated by O radicals) may be denser than the structure of the lower part of the cap layer (not penetrated by O radicals). Subsequently, photolithography processes and etching processes are implemented to remove a part of the cap layer 60 and a part of the dielectric layer 50, and at least a contact hole O' can be formed in the cap layer 60 and the dielectric layer 50, Furthermore, a self-aligned metal silicide process is performed to form the metal silicide layer 62 at the bottom of each of the contact holes O'. Then, as illustrated above, a barrier layer (not shown), a seed layer (not shown) and a conductive layer 64 are sequentially formed in each of the contact holes O', and each of the contact holes O' is filled up with the conductive layer 64. Finally, a planarization process is implemented to align the surface of the conductive layer 64 with the surface of the cap layer 60. Accordingly, a metal interconnection structure is completed. As the manufacturing processes of the metal interconnection structure are known to those skilled in the art, the details are omitted herein for brevity.

In conclusion, a flowable chemical vapor deposition (FCVD) process is performed to form the dielectric layer in the present invention, so the formed dielectric layer can therefore overall cover the substrate, and the recess having high aspect ratio can be totally filled up with the dielectric layer without voids or spaces, i.e. the dielectric layer formed through FCVD process provides good gap filling effect. Additionally, after the planarization process performed on a dielectric layer, the oxygen plasma is further used to treat the surface of the dielectric layer for doping oxygen radicals into a part of the dielectric layer, so the dangling bonds in the dielectric layer may therefore crosslink in order to evaluate the structural density of the dielectric layer; for example, the structure of the upper part of the dielectric layer (penetrated by O radicals) may be denser than the structure of the lower part of the dielectric layer (not penetrated by O radicals). Accordingly, the dielectric layer may not be damaged during the following etching processes and the following cleaning processes, and the structural completeness and the isolation effect of the dielectric layer can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a dielectric layer, comprising:
performing a flowable chemical vapor deposition (FCVD) process for forming a dielectric layer on a substrate, wherein the FCVD process comprises:
forming a flowable dielectric material layer on the substrate;
performing a curing process on the flowable dielectric material layer; and
performing a thermal treatment process;
performing a chemical mechanical polishing (CMP) process on the dielectric layer; and
performing a surface treatment process directly on the surface of the planarized dielectric layer after the chemical mechanical polishing process, wherein the surface treatment process comprises introducing an oxygen plasma.

2. The method of fabricating a dielectric layer according to claim 1, wherein the oxygen plasma comprises oxygen radicals (O radicals).

3. The method of fabricating a dielectric layer according to claim 1, wherein a processing temperature range of the surface treatment process is substantially between 300 degrees centigrade (° C.) and 400 degrees centigrade.

4. The method of fabricating a dielectric layer according to claim 1, wherein a material of the flowable dielectric material layer comprises trisilylamine (TSA).

5. The method of fabricating a dielectric layer according to claim 1, wherein the curing process comprises performing an ozone ($O_3$) plasma treatment process.

6. The method of fabricating a dielectric layer according to claim 1, wherein the thermal treatment process comprises:
a steam-containing thermal treatment process, wherein a processing temperature range of the steam-containing thermal treatment process is substantially between 600 degrees centigrade (° C.) and 800 degrees centigrade; and
a nitrogen-containing thermal treatment process, wherein a processing temperature of the nitrogen-containing thermal treatment process is substantially higher than 1000 degrees centigrade.

7. The method of fabricating a dielectric layer according to claim 1, further comprising performing a thermal treatment process after the surface treatment process, wherein a processing temperature of the thermal treatment process is higher than a processing temperature of the surface treatment process.

8. The method of fabricating a dielectric layer according to claim 1, before forming the dielectric layer on the substrate, further comprising forming a liner on the substrate.

9. The method of fabricating a dielectric layer according to claim 8, wherein the liner comprises a monolayered structure or a multilayer structure, and a material of the liner comprises silicon oxide, silicon nitride, silicon oxynitride or any combination thereof.

10. A method of fabricating a shallow trench isolation (STI), comprising:
forming a recess in a substrate;
forming a dielectric layer to fill the recess;
performing a chemical mechanical polishing (CMP) process on the dielectric layer; and
performing a surface treatment process directly on the surface of the planarized dielectric layer after the chemical mechanical polishing process, wherein the surface treatment process comprises introducing an oxygen plasma.

11. The method of fabricating a shallow trench isolation (STI) according to claim 10, wherein the oxygen plasma comprises oxygen radicals (O radicals).

12. The method of fabricating a shallow trench isolation (STI) according to claim 10, wherein a processing temperature range of the surface treatment process is substantially between 300 degrees centigrade (° C.) and 400 degrees centigrade.

13. The method of fabricating a shallow trench isolation (STI) according to claim 10, wherein the method of forming the dielectric layer comprises performing a flowable chemical vapor deposition (FCVD) process, and the flowable chemical vapor deposition process comprises: forming a flowable dielectric material layer on the substrate; performing a curing process on the flowable dielectric material layer; and performing a thermal treatment process.

14. The method of fabricating a shallow trench isolation (STI) according to claim 13, wherein the curing process comprises performing an ozone ($O_3$) plasma treatment process.

15. The method of fabricating a shallow trench isolation (STI) according to claim 13, wherein the thermal treatment process comprises:
a steam-containing thermal treatment process, wherein a processing temperature range of the steam-containing thermal treatment process is substantially between 600 degrees centigrade (° C.) and 800 degrees centigrade; and
a nitrogen-containing thermal treatment process, wherein a processing temperature of the nitrogen-containing thermal treatment process is substantially higher than 1000 degrees centigrade.

16. The method of fabricating a shallow trench isolation (STI) according to claim 10, further comprising performing a thermal treatment process after the surface treatment process, wherein a processing temperature of the thermal treatment process is higher than a processing temperature of the surface treatment process.

17. The method of fabricating a shallow trench isolation (STI) according to claim 10, wherein the method of forming the recess, comprises:
forming a patterned mask on the substrate;
performing an etching process to form the recess; and
forming a liner covering a surface of the recess.

18. The method of fabricating a shallow trench isolation (STI) according to claim 17, wherein the liner comprises a monolayered structure or a multilayer structure, and a material of the liner comprises silicon oxide, silicon nitride, silicon oxynitride or any combination thereof.

19. The method of fabricating a shallow trench isolation (STI) according to claim 10, wherein at least a fin structure is disposed on the substrate, and the recess is formed at least a side of the fin structure.

* * * * *